United States Patent
Perner et al.

(10) Patent No.: US 6,999,366 B2
(45) Date of Patent: Feb. 14, 2006

(54) MAGNETIC MEMORY INCLUDING A SENSE RESULT CATEGORY BETWEEN LOGIC STATES

(75) Inventors: Frederick A. Perner, Palo Alto, CA (US); Jonathan Jedwab, Vancouver (CA); James A. Davis, Richmond, VA (US); David McIntyre, Boise, ID (US); David Banks, Bristol (GB); Stewart Wyatt, Boise, ID (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 130 days.

(21) Appl. No.: 10/727,273

(22) Filed: Dec. 3, 2003

(65) Prior Publication Data

US 2005/0122767 A1 Jun. 9, 2005

(51) Int. Cl.
*G11C 7/02* (2006.01)
(52) U.S. Cl. ...................................... 365/209; 365/158
(58) Field of Classification Search ............ 365/209 O, 365/158 X, 171
See application file for complete search history.

(56) References Cited

U.S. PATENT DOCUMENTS

| | | | |
|---|---|---|---|
| 6,188,615 B1 | 2/2001 | Perner et al. | |
| 6,262,625 B1 | 7/2001 | Porterfield | |
| 6,504,779 B1 | 1/2003 | Perner | |
| 6,584,589 B1 * | 6/2003 | Perner et al. | 714/721 |
| 6,898,134 B1 * | 5/2005 | Smith et al. | 365/201 |
| 2003/0023922 A1 | 1/2003 | Davis et al. | |
| 2003/0023923 A1 | 1/2003 | Davis et al. | |
| 2003/0023925 A1 | 1/2003 | Davis et al. | |
| 2003/0023928 A1 | 1/2003 | Jedwab et al. | |

* cited by examiner

*Primary Examiner*—Van Thu Nguyen

(57) ABSTRACT

Embodiments of the present invention provide a magnetic memory. In one embodiment, the magnetic memory comprises an array of memory cells configured to provide resistive states, and a read circuit. The read circuit is configured to sense a resistance through a memory cell in the array of memory cells to obtain a sense result and categorize the sense result into one of at least three different categories comprising a middle category situated between the resistive states.

32 Claims, 8 Drawing Sheets

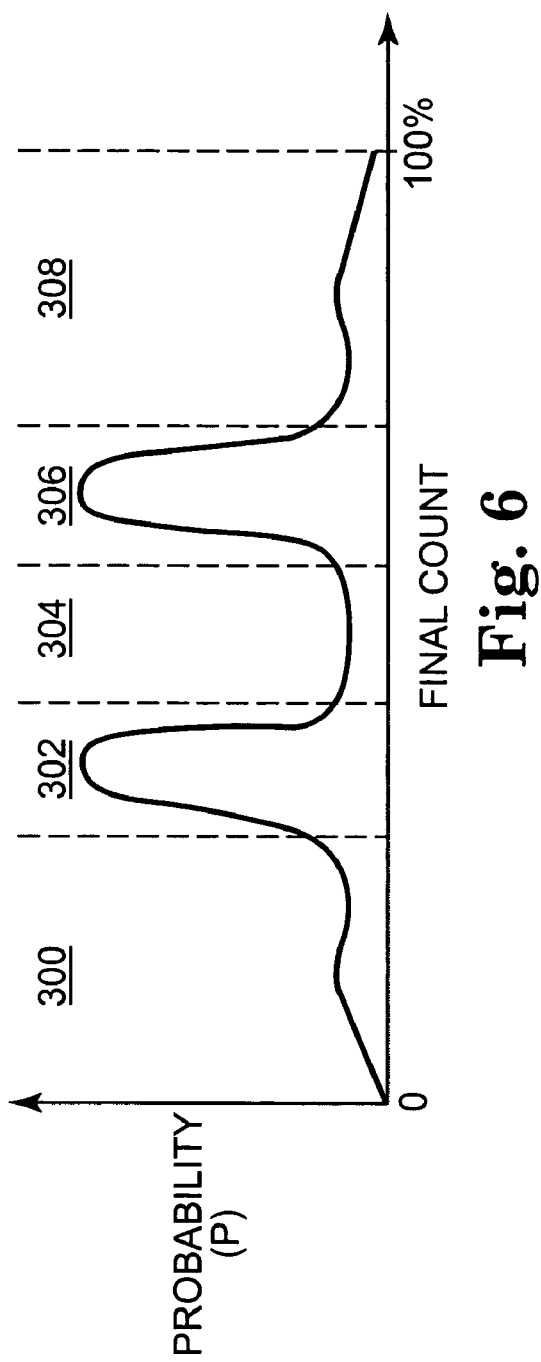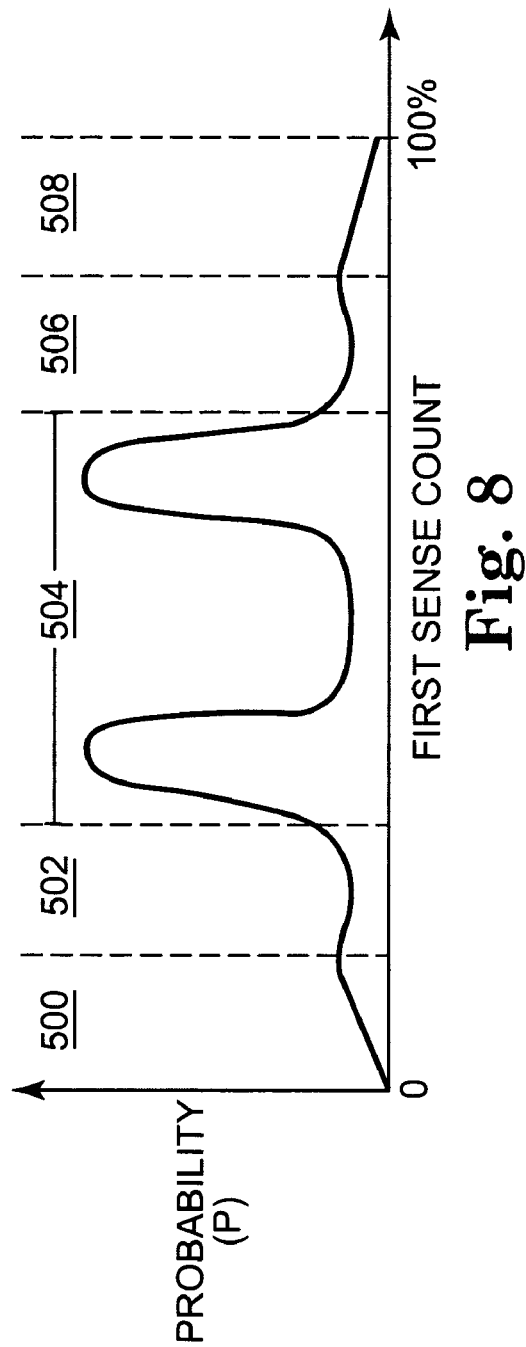

MAGNETIC MEMORY INCLUDING A SENSE RESULT CATEGORY BETWEEN LOGIC STATES

BACKGROUND OF THE INVENTION

Non-volatile memory devices include memory cells that have at least two stable states. In some non-volatile memory devices, the resistance through a memory cell differs based on the state of the memory cell. The resistance through the memory cell is higher in a first state relative to the resistance through the memory cell in a second state. These memory devices can be reprogrammable or one-time programmable devices.

One type of reprogrammable non-volatile memory known in the art relies on magnetic memory cells. These devices, known as magnetic random access memory (MRAM) devices, include an array of magnetic memory cells. The magnetic memory cells may be of different types. For example, the memory cells can be magnetic tunnel junction (MTJ) memory cells or giant magnetoresistive (GMR) memory cells.

Generally, the magnetic memory cell includes a layer of magnetic film in which the orientation of magnetization is alterable and a layer of magnetic film in which the orientation of magnetization may be fixed or "pinned" in a particular direction. The magnetic film having alterable magnetization is referred to as a sense layer or data storage layer and the magnetic film that is fixed is referred to as a reference layer or pinned layer. In an MTJ memory cell, a barrier layer separates the sense layer and the reference layer.

Conductive traces referred to as word lines and bit lines are routed across the array of memory cells. Word lines extend along rows of the memory cells, and bit lines extend along columns of the memory cells. Memory cells store a bit of information as an orientation of magnetization in a sense layer at each intersection of a word line and a bit line. The orientation of magnetization in the sense layer aligns along an axis of the sense layer referred to as its easy axis. Magnetic fields are applied to flip the orientation of magnetization in the sense layer along its easy axis to either a parallel or anti-parallel orientation with respect to the orientation of magnetization in the reference layer.

In one embodiment, the word lines and bit lines are routed across the array of memory cells to aid in flipping the orientation of magnetization in sense layers. The word lines extend along rows of the memory cells near the sense layers. The bit lines extend along columns of the memory cells near the reference layers. The word lines and bit lines are electrically coupled to a write circuit.

During a write operation, the write circuit selects one word line and one bit line to change the orientation of magnetization in the sense layer of the memory cell situated at the conductors crossing point. The write circuit supplies write currents to the selected word line and bit line to create magnetic fields in the selected memory cell. The magnetic fields combine to switch the orientation of magnetization in the selected memory cell from parallel to anti-parallel or vice-versa.

The resistance through a memory cell differs according to the parallel or anti-parallel orientation of magnetization of the sense layer and the reference layer. The resistance is highest when the orientation is anti-parallel, which can be referred to as the logic "1" state, and lowest when the orientation is parallel, which can be referred to as the logic "0" state. The resistive state of the memory cell can be determined by sensing the resistance through the memory cell.

Word lines and bit lines also aid in sensing the resistance through a memory cell. Word lines, which extend along rows, are electrically coupled to sense layers and bit lines, which extend along columns, are electrically coupled to reference layers. Word lines and bit lines are also electrically coupled to a read circuit to sense the resistance and state of a memory cell.

During a read operation, the read circuit selects one word line and one bit line to sense the resistance of the memory cell situated at the conductors crossing point. The read circuit can supply a voltage across the selected memory cell to generate a current through the memory cell. The current through the memory cell is proportional to the resistance through the memory cell and is used to differentiate a high resistive state from a low resistive state.

Although the memory device is generally reliable, failures can occur that affect the ability of the memory device to store data reliably. The failures include physical failures related to memory cells and sensing failures related to the read circuit.

Physical failures can result from many causes including manufacturing imperfections and aging of the device with use. Failure mechanisms take many forms including shorted memory cells and open memory cells. A shorted memory cell has a resistance value that is much lower than expected. An open memory cell has a resistance value that is much higher than expected. Shorted and open memory cells can affect other memory cells lying in the same row and the same column.

Sensing failures can result from many causes including temperature and voltage changes. The read circuit is calibrated at one set of temperature and voltage values. Where the temperature and/or voltage changes, the read circuit may be out of calibration. In this situation, the read circuit may not accurately sense the state of a memory cell due to calibration problems. To reliably store data in a memory cell, it is important to have information about the condition of the memory cell and whether the read circuit is properly calibrated.

SUMMARY OF THE INVENTION

Embodiments of the present invention provide a magnetic memory. In one embodiment, the magnetic memory comprises an array of memory cells configured to provide resistive states, and a read circuit. The read circuit is configured to sense a resistance through a memory cell in the array of memory cells to obtain a sense result and categorize the sense result into one of at least three different categories comprising a middle category situated between the resistive states.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 6 is a graph illustrating the probability that a read operation result is categorized into one of five categories.

FIG. 8 is a graph for another embodiment illustrating the probability that a first sense operation result is categorized into one of five categories.

DETAILED DESCRIPTION

Figure 1:
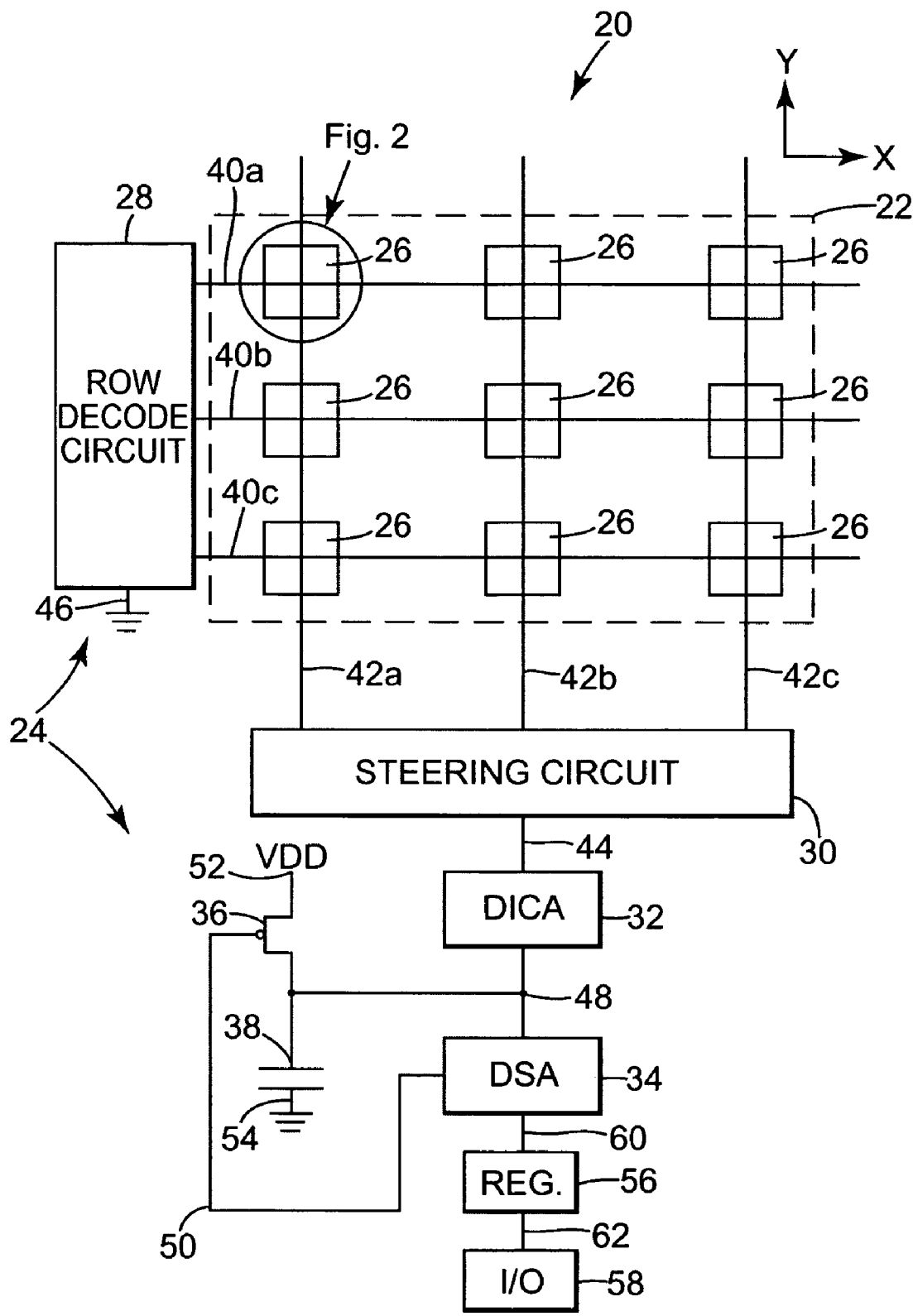
FIG. 1 is a diagram illustrating an exemplary embodiment of a magnetic memory, according to the present invention.

FIG. 1 is a diagram illustrating an exemplary embodiment of a magnetic memory device 20, according to the present invention. The memory device 20 includes a magnetic memory cell array 22, a read circuit 24 and a write circuit (not shown for clarity). The memory cell array 22 includes magnetic memory cells 26 electrically coupled to the read circuit 24.

The read circuit 24 is configured to sense the resistance through a memory cell 26 and provide a sense result, such as a count, corresponding to the sensed resistance. In the exemplary embodiment, read circuit 24 is configured to provide a count and categorize the count into one of five categories, also referred to as regions. The five regions include a low resistive state region, a high resistive state region, an out-of-range low region, an out-of-range high region and a middle region, referred to as a dubious region. The dubious region is situated between the low resistive state region and the high resistive state region. The out-of-range low region is situated at a lower resistance value than the low resistive state region, and the out-of-range high region is situated at a higher resistance value than the high resistive state region. The read circuit 24 sets an out-of-range flag, in the event the count is categorized into one of the out-of-range regions. Also, read circuit 24 sets a dubious flag in the event the count is categorized into the dubious region.

In another embodiment, read circuit 24 is configured to sense the resistance through a memory cell 26 in a first sense operation of a multiple sense read operation and provide a first sense result, such as a first count. The memory device 20 and read circuit 24 respond to a first count that indicates a short or an open by immediately calibrating read circuit 24 in an immediate calibration response. In the event the first count is situated in a middle no calibration region, the read circuit 24 completes the multiple sense read operation to obtain a final result, referred to as a final count. In the event the first count is situated between the short and middle no calibration region or between the open and middle no calibration region, the read circuit 24 sets a calibration flag for calibrating read circuit 24 at a later time in a delayed calibration response. After setting the flag for calibration, read circuit 24 completes the read operation and provides the final result, referred to as the final count.

The final count is categorized into one of five categories, referred to as regions, including a low resistive state region, a high resistive state region, an out-of-range low region, an out-of-range high region and a middle region, referred to as a dubious region. The dubious region is situated between the low resistive state region and the high resistive state region. The out-of-range low region is situated at a lower resistance value than the low resistive state region, and the out-of-range high region is situated at a higher resistance value than the high resistive state region. The read circuit 24 sets an out-of-range flag in the event the count is categorized into one of the out-of-range regions. Also, read circuit 24 sets a dubious flag in the event the count is categorized into the dubious region.

The memory cells 26 in array 22 are arranged in rows and columns, with the rows extending along an x-direction and the columns extending along a y-direction. Only a relatively small number of memory cells 26 are shown to simplify the illustration of the memory device 20. In other embodiments, arrays of any suitable size can be used, such as in a 1 Mbit array embodiment where the array is 1024 memory cells 26 high by 1024 memory cells 26 wide. In addition, macro-arrays can be formed using a plurality of individual arrays, such as the 1 Mbit arrays. Memory devices with a large overall data storage capacity can be built using multiple arrays, without the individual arrays becoming so large that they are difficult to manufacture and control. Also, the arrays can be manufactured in layers to produce three dimensional macro-arrays.

In one magnetic memory embodiment having a storage capacity of 128 Mbytes, 1024 1 Mbit arrays are arranged in a macro-array that is 16 arrays wide by 16 arrays high, with four stack layers. Optionally the memory device comprises more than one such macro-array. In the 128 Mbyte macro-array embodiment, the magnetic memory comprises row decoders that select one row and column decoders that select a plurality of columns to select a plurality of memory cells in each 1 Mbit array. The memory device accesses a plurality of 1 Mbit arrays at the same time. The cells accessed within each of the plurality of arrays correspond to a small portion of a unit of data. Together, the accessed cells provide a whole unit of data, such as a whole sector unit of 512 bytes or at least a substantial portion of the sector. Each of the plurality of arrays are accessed substantially simultaneously. In an alternative embodiment, the magnetic memory comprises column decoders that select one column and row decoders that select a plurality of rows.

In the exemplary embodiment, read circuit 24 includes a row decode circuit 28, a steering circuit 30, a direct injection charge amplifier 32, a digital sense amplifier 34, a reset switch 36 and an integrator capacitor 38. The row decode circuit 28 is electrically coupled to word lines 40a–40c, and the steering circuit 30 is electrically coupled to bit lines 42a–42c. The conductive word lines 40a–40c extend along the x-direction in a plane on one side of array 22, and the conductive bit lines 42a–42c extend along the y-direction in a plane on an opposing side of array 22. There is one word line 40 for each row of the array 22, and one bit line 42 for each column of the array 22. A memory cell 26 is located at each cross-point of a word line 40 and a bit line 42. The steering circuit 30 is electrically coupled to charge amplifier 32 through charge amplifier conductor 44, and the row decode circuit is electrically coupled to ground at 46.

The charge amplifier 32, sense amplifier 34, reset switch 36 and integrator capacitor 38 are electrically coupled together at node 48. In addition, sense amplifier 34 is electrically coupled to the gate of reset switch 36 through switch control conductor 50. The reset switch 36 is electrically coupled to VDD at 52 and the integrator capacitor 38 is electrically coupled to ground at 54.

The memory device 20 includes an output register 56 and an input/output (I/O) pad 58. An output of the sense amplifier 34 is electrically coupled to the output register 56 through sense amplifier output conductor 60. The output register 56 is electrically coupled to the I/O pad 58 through output conductor 62. In the exemplary embodiment, only one read circuit 24, one output register 56 and one I/O pad 58 are shown. In other embodiments, any suitable number of read circuits 24, output registers 56 and I/O pads 58 are included.

In the exemplary embodiment, the write circuit (not shown) is electrically coupled to word lines 40a–40c and bit lines 42a–42c. The write circuit is configured to provide a first write current through a selected word line 40a–40c in either direction, and a second write current through a selected bit line 42a–42c in either direction. A memory cell 30 is located at each cross-point of a word line 40 and a bit line 42.

During a write operation, the write circuit selects one word line 40a–40c and one bit line 42a–42c to set or switch the orientation of magnetization in the sense layer of the memory cell 26 located at the cross-point. The write circuit provides the first write current to the selected word line 40a–40c and the second write current to the selected bit line 42a–42c. The first write current creates a magnetic field around the selected word line 40a–40c, according to the right hand rule, and the second write current creates a magnetic field around the selected bit line 42a–42c, according to the right hand rule. These magnetic fields combine to set or switch the orientation of magnetization in the sense layer of the selected memory cell 26.

The read circuit 24 senses the resistance through memory cells 26 in array 22 and provides sense results, such as counts, corresponding to the sensed resistance values. In the exemplary embodiment, row decode circuit 28 includes switches to select one word line 40a–40c and electrically couple the selected word line 40a–40c to ground. The steering circuit 30 includes switches to select one bit line 42a–42c and electrically couple the selected bit line 42a–42c to charge amplifier 32. The charge amplifier 32 provides a constant voltage to the selected bit line 42a–42c. A sense current flows through the selected bit line 42a–42c and the selected memory cell 26 to the selected word line 40a–40c and ground. The sense current, which flows through the selected memory cell 26, corresponds to the resistance through the selected memory cell 26.

The capacitor 38 is charged through reset switch 36 toward supply voltage VDD. The capacitor 38 provides the sense current to the selected memory cell 26 through charge amplifier 32. In the exemplary embodiment, the reset switch 36 is a p-type metal oxide semiconductor (PMOS) transistor. In other embodiments, the reset switch 36 can be a transistor combination or another type of transistor, such as an n-type metal oxide semiconductor (NMOS) transistor.

The digital sense amplifier 34 controls reset switch 36, compares the voltage at node 48 to a reference voltage, provides a sense result and provides an output signal to output register 56. To begin a sense operation, sense amplifier 34 turns on reset switch 36 to charge capacitor 38 toward supply voltage VDD. Sense amplifier 34 opens reset switch 36 and compares the voltage at node 48 to a reference voltage. The voltage at node 48 decreases at a rate that is proportional to the sense current and resistance through selected memory cell 26. The sense amplifier 34 includes a counter, which counts until the voltage at node 48 has decreased to the reference voltage. The resulting count corresponds to the resistance of the selected memory cell 26.

In the exemplary embodiment, a read operation includes three sense operations and two write operations. First, the read circuit 24 senses the resistance through the selected memory cell 26 to obtain a first count. The first count is multiplied by two and inverted to make it into a negative value that is put into the counter of sense amplifier 34 before the second sense operation. The write circuit writes the selected memory cell 26 to a high resistive state, referred to herein as a logic "1", and senses the resistance through the selected memory cell 26 in a second sense operation to increment the counter to a second count. The write circuit writes the selected memory cell 36 to a low resistive state, referred to herein as a logic "0", and senses the resistance through the selected memory cell 26 in a third sense operation. The third sense operation increments the second count to a third count that is the final count. The resulting final count in the counter corresponds to the initial resistive state of selected memory cell 26, as described in more detail later in this specification. In other embodiments, the read operation includes more or less than three sense operations and two write operations. For example, in one embodiment, a third write operation is performed to write the sensed result back to the selected memory cell 26.

In the exemplary embodiment, the sense amplifier 34 categorizes the final count into one of five categories. The five categories include valid low and high resistive state regions, out-of-range low and out-of-range high regions, and the dubious region. The dubious region is situated between the low and high resistive state regions. The out-of-range low region includes resistance values below the low resistive state region, and the out-of-range high region includes resistance values above the high resistive state region. Sense amplifier 34 provides a logic "0" or "1" output signal to output register 56. In addition, sense amplifier 34 provides status flags to indicate the region of the final count.

In another embodiment, sense amplifier 34 categorizes the first count in a multiple sense read operation. The sense amplifier 34 triggers an interrupt to calibrate read circuit 24 immediately in the event the first count indicates a short or an open. In the event the first count is situated between a short and the middle no calibration region or between an open and the middle no calibration region, sense amplifier 34 sets a flag for calibrating read circuit 24 at a later time. After setting the flag, read circuit 24 completes the read operation and provides a resulting final count. The final count is categorized into one of five regions including low and high resistive state regions, out-of-range low and out-of-range high regions and the dubious region. The dubious region is situated between the valid low and high resistive state regions. The out-of-range low region includes resistance values below the low resistive state region, and the out-of-range high region includes resistance values above the high resistive state region. The sense amplifier 34 provides a logic "0" or "1" output signal to the output register 56 and status flags.

During a sense operation, read circuit 24 selects a word line 40a–40c and a bit line 42a–42c to sense the resistance through the memory cell 26 located at the cross-point of the selected word line 40a 40c and bit line 42a–42c. The row decode circuit 28 is controlled to select a word line 40a–40c, and the steering circuit 30 is controlled to select a bit line 42a–42c. The row decode circuit 28 electrically couples the selected word line 40a–40c to ground. The steering circuit 30 electrically couples the selected bit line 42a–42c to charge amplifier 32. The charge amplifier 32 provides a constant voltage and sense current to the selected bit line 42a–42c. Sense amplifier 34 turns on reset switch 36 to charge capacitor 38 toward supply voltage VDD. Sense amplifier 34 begins counting as it opens reset switch 36. The capacitor 38 provides the sense current through charge amplifier 32. The sense amplifier 34 compares the voltage at node 48 to a reference voltage and counts until the voltage at node 48 decays to the reference voltage.

In a multiple sense read operation, a first sense operation is performed to obtain a first sense count. The first sense count is multiplied by two and inverted to make it into a negative value. The negative value is stored back into the counter of sense amplifier 34 before a second sense operation. The write circuit writes the selected memory cell 26 to a logic "1" and sense amplifier 34 senses the resistance through the selected memory cell 26 in the second sense operation. The counter in sense amplifier 34 is incremented to the second count during the second sense operation. The write circuit writes the selected memory cell 26 to a logic "0" and sense amplifier 34 senses the resistance through the selected memory cell 26 in a third sense operation. The counter in sense amplifier 34 is incremented to the third and final count during the third sense operation. The sense amplifier 34 categorizes the final count into one of five categories, provides a logic "0" or "1" output signal to output register 56 and provides status flags to a controller.

In another embodiment, the first sense count is categorized into an immediate calibration, a flag for calibration or a no calibration region. In the event the first count is categorized into a flag for calibration or no calibration region, memory device 20 proceeds to complete the multiple sense read operation. The final count is categorized into one of five categories.

Figure 2:
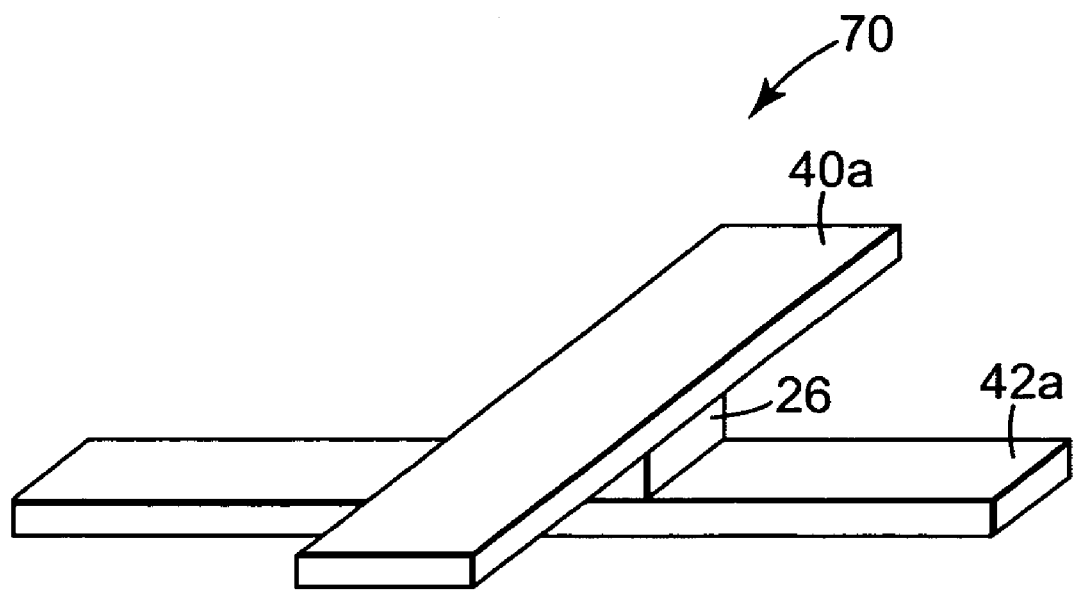
FIG. 2 is a diagram illustrating an exemplary embodiment of an array section.

FIG. 2 is a diagram illustrating an exemplary embodiment of an array section, indicated at 70. Array section 70 includes word line 40a, a memory cell 26 and bit line 42a. Memory cell 26 is located between word line 40a and bit line 42a. In the exemplary embodiment, word line 40a and bit line 42a are orthogonal to one another. In other embodiments, word line 40a and bit line 42a can lie in other suitable angular relationships to one another.

In the exemplary embodiment, word line 40a and bit line 42a are electrically coupled to read circuit 24 and the write circuit. The write circuit provides write currents to word line 40a and bit line 42a to create magnetic fields, according to the right hand rule, around word line 40a and bit line 42a, and in memory cell 26. The magnetic fields combine to set or switch the state of memory cell 26.

During a read operation, read circuit 24 senses the resistance through memory cell 26 three times in a multiple sense read operation. In a sense operation, read circuit 24 provides a constant voltage to bit line 42a. A sense current flows through bit line 42a and memory cell 26 to word line 40a and ground. The sense current is provided by capacitor 38 and the magnitude of the sense current through memory cell 26 corresponds to the resistance through memory cell 26.

In a first sense operation, sense amplifier 34 provides a first count corresponding to the resistance through memory cell 26. The first count is multiplied by two and inverted to make it into a negative value that is stored back into the counter in sense amplifier 34 to begin the second sense operation. Memory cell 26 is written to a high resistive state and the counter in sense amplifier 34 is incremented to a second count during the second sense operation. The number of increments corresponds to the high resistive state of memory cell 26. The memory cell 26 is written to a low resistive state and the counter in sense amplifier 34 is incremented to a third and final count. The number of increments corresponds to the low resistive state of memory cell 26. The final count is categorized into one of five categories. The sense amplifier 34 provides a logic output signal to output register 56 and status flags.

In another embodiment, the first count is categorized into a calibrate immediately, flag for calibration or no calibration category. In the event the first count is categorized into a calibrate immediately category, read circuit 24 is calibrated and the resistance through memory cell 26 is sensed again. Where the resistance through memory cell 26 is categorized into the calibrate immediately category n times, a flag is set indicating that memory cell 26 is an open or a short. The value of n can be any suitable number and in the exemplary embodiment the value of n is two. In addition, one flag is used to indicate a short and another flag is used to indicate an open.

In the event the first count is situated in the flag for calibration or no calibration category, the read operation continues with multiple write and sense operations to obtain a final count. The final count is categorized into one of five categories and the sense amplifier 34 provides a logic output signal to output register 56 and status flags to a controller.

Figure 3:
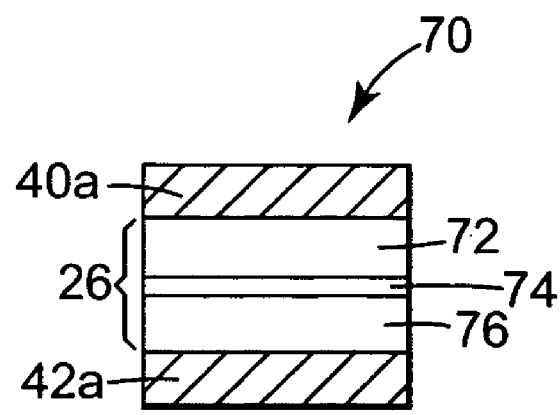
FIG. 3 is a diagram illustrating a cross section of an exemplary embodiment of an array section.

FIG. 3 is a diagram illustrating a cross section of the exemplary embodiment of array section 70. The array section 70 includes memory cell 26 located between word line 40a and bit line 42a. Memory cell 26 includes a sense layer 72, a spacer layer 74 and a reference layer 76. The spacer layer 74 is located between the sense layer 72 and the reference layer 76. The sense layer 72 is located next to word line 40a, and the reference layer 76 is located next to bit line 42a. The sense layer 72 has an alterable orientation of magnetization and the reference layer 76 has a pinned orientation of magnetization.

In the exemplary embodiment, memory cell 26 is an MTJ, spin tunneling device with spacer layer 74 being an insulating barrier layer through which an electrical charge migrates during read operations. Electrical charge migrations through spacer layer 74 occur in response to a voltage applied across memory cell 26 and a sense current provided through memory cell 26. In an alternative embodiment, a GMR structure can be used for memory cell 26 with spacer layer 74 being a conductor, such as copper.

Figure 4:
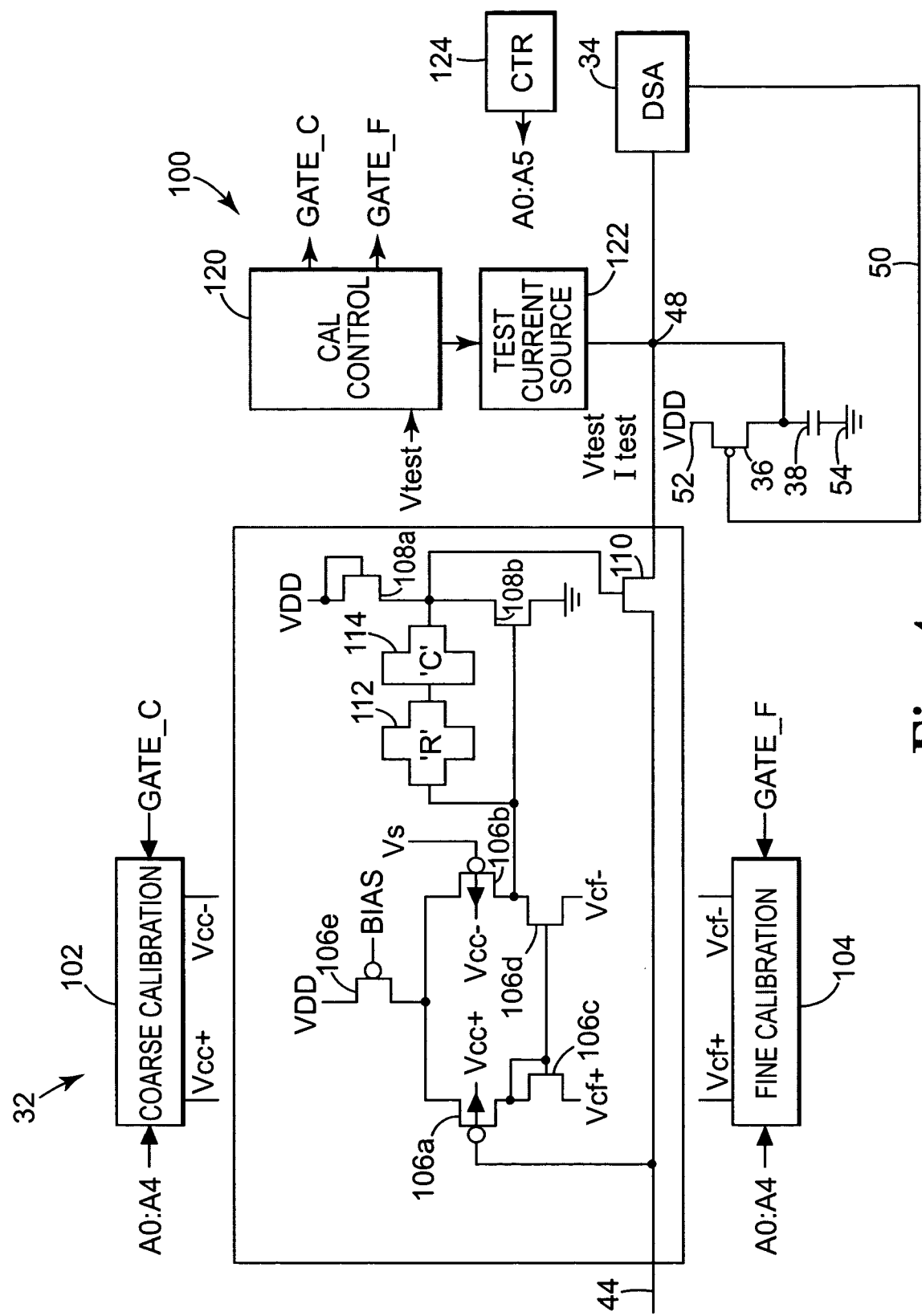
FIG. 4 is a diagram illustrating an exemplary embodiment of a direct injection charge amplifier and digital offset calibration circuitry.

FIG. 4 is a diagram illustrating an exemplary embodiment of a direct injection charge amplifier 32 and digital offset calibration circuitry, indicated at 100. The charge amplifier 32 includes a PMOS differential amplifier, a coarse calibration circuit 102 and a fine calibration circuit 104. The PMOS differential amplifier includes first, second and third PMOS transistors 106a, 106b and 106e and first and second NMOS transistors 106c and 106d that provide a controlled current path. The PMOS transistors 106a and 106b are located in isolated n-type wells in a substrate that allows the back gate bias of the first and second PMOS transistors 106a and 106b to be controlled. Arrows extending through the gates of the PMOS transistors 106a and 106b schematically represent connections to the substrate. The substrate is common to NMOS transistors 106c and 106d.

The differential amplifier is followed by a second stage amplifier circuit including two transistors 108a and 108b for boosting the gain to control an output using a feedback loop. The feedback loop includes second stage transistors 108a and 108b followed by a current source transistor 110 and first PMOS transistor 106a. The second stage transistors 108a and 108b provide a control signal to the gate of current source transistor 110. A feedback signal is provided to first PMOS transistor 106a through current source transistor 110.

Closed loop stability may be an issue as a consequence of working with a high gain amplifier. Frequency compensation components include a resistor circuit 112 and a capacitor circuit 114 that control the stability of second stage transistors 108a and 108b. The resistor circuit 112 and capacitor circuit 114 reduce the high frequency gain of the second stage transistors 108a and 108b to thereby prevent the closed loop operational amplifier from being unstable.

The current source transistor 110 includes a gate coupled to second stage transistors 108a and 108b and capacitor circuit 114. A drain to source path through current source transistor 110 is electrically coupled to the gate of first PMOS transistor 106a through charge amplifier conductor 44. The drain to source path through current source transistor 110 is also electrically coupled to node 48 of memory device 20.

In normal operation, a supply voltage VDD is provided to third PMOS transistor 106e and second stage transistor 108a. A BIAS voltage is applied to the gate of third PMOS transistor 106e, and a sense voltage Vs is provided to the gate of second PMOS transistor 106b. The charge amplifier 32 operates to maintain the sense voltage Vs on charge amplifier conductor 44, due to the virtual short across the inputs of the differential amplifier between the gate of first PMOS transistor 106a and the gate of second PMOS transistor 106b. Charge amplifier conductor 44 is electrically coupled to a selected memory cell 26.

Capacitor 38 is electrically coupled to node 48 and provides a sense current through current source transistor 110 to charge amplifier conductor 44 and the selected memory cell 26. The charge amplifier 32 senses and controls the voltage on charge amplifier conductor 44 by adjusting the current through the current source transistor 110 and holding the current through the current source transistor 110 constant for a period of time. The sense current flows through the current source transistor 110 and the selected memory cell 26 to discharge the capacitor 38. The sense amplifier 34 senses and compares the voltage at node 48 to a reference voltage to obtain a sense result.

The coarse calibration circuit 102 performs a coarse offset correction. The coarse calibration circuit 102 performs the coarse offset correction by applying a back gate bias voltage Vcc+ and Vcc− to the isolated wells of the first and second PMOS transistors 106a and 106b. The level of the back gate bias voltage Vcc+ and Vcc− is set according to a first digital number stored in the coarse calibration circuit 102. The sensitivity of the offset voltage to back gate bias voltage variations can be rather large. Therefore, applying the back gate bias voltage Vcc+ and Vcc− is well suited for making coarse corrections to the offset voltage.

The fine calibration circuit 104 performs a fine offset correction. The fine offset correction is performed by adjusting impedances of the transistors 106a–106e in the differential amplifier. The amount of the impedance adjustment is determined by a second digital number stored in the fine calibration circuit 104.

The calibration circuit 100 includes a calibration control circuit 120, a test current source 122 and a counter 124 for determining the first and second digital numbers stored in the coarse and fine calibration circuits 102 and 104, respectively. During calibration, test current source 122 supplies a test current Itest at node 48. The magnitude of test current Itest can be selected to be approximately the value of the expected sense current in the absence of offset error.

At the start of calibration mode, counter 124 begins counting from zero. The count is supplied to coarse and fine calibration circuits 102 and 104 via a control bus A0:A5 and gate controls GATE_C and GATE_F. Coarse calibration is performed while the most significant bit A5 of the count is low, and fine calibration is performed while the most significant bit A5 is high. During coarse calibration, the level of the back gate bias voltage Vcc+ and Vcc− is changed each time the count is incremented. A voltage excursion at node 48 is examined while the back gate bias voltage Vcc+ and Vcc− is changed. The voltage Vtest at node 48 is pulled high while the test current Itest is greater than the sense current of charge amplifier 32. The voltage Vtest at node 48 is pulled low while the test current Itest is less than or equal to the sense current. As node 48 goes from high to low or vice-versa, the voltage excursion at node 48 is large enough to serve as a logic input to complementary metal oxide semiconductor (CMOS) logic gates in calibration control circuit 120.

A voltage excursion occurs as the new count causes the back gate bias voltage to change, such that Itest is less than or equal to the sense current. The count that caused the voltage excursion is stored in the coarse calibration circuit 102. This count is the first digital number, which sets the back gate bias voltage Vcc+ and Vcc−. The number stored in the coarse calibration circuit 102 does not change as the count is incremented further.

Fine calibration begins, after the count has reached a zero and four ones and the next increment causes the most significant bit A5 to go high and the remaining bits A0–A4 to go low. The initial level of test current Itest is less than the sense current. Each time the count is incremented during fine calibration, the transistor impedance is changed to a new level. Another voltage excursion occurs due to the new count causing the transistor impedance to change such that Itest is greater than or equal to the sense current. The count that caused the voltage excursion is stored in the fine calibration circuit 104. This count is the second digital number that is used to set the transistor impedance.

One embodiment of a charge amplifier 32 suitable for use with the present invention is disclosed and described in U.S. Pat. No. 6,262,625, issued to Perner et al. on Jul. 17, 2001, entitled "Operational Amplifier With Digital Offset Calibration," which is incorporated herein by reference.

Figure 5:
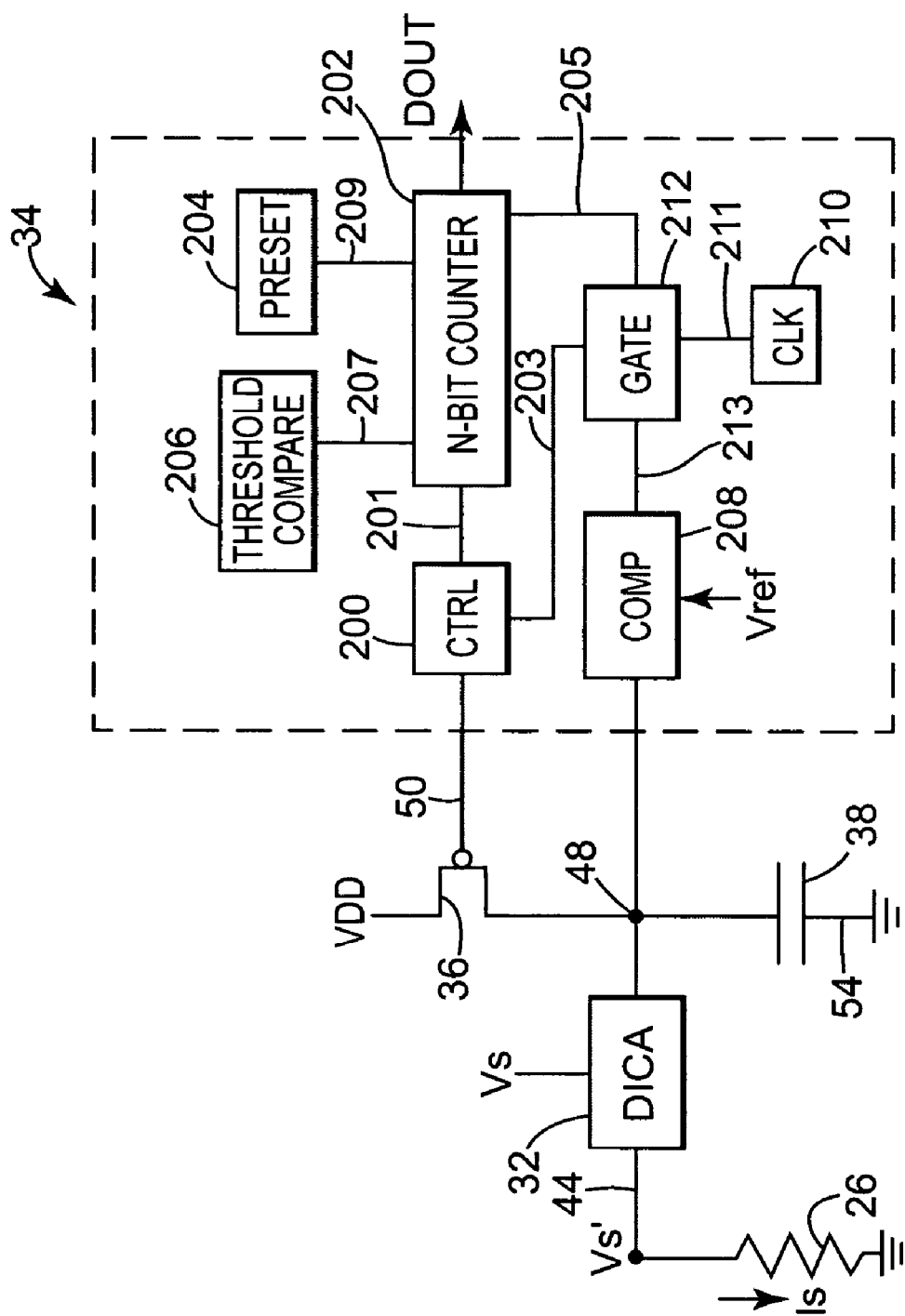
FIG. 5 is a diagram illustrating an exemplary embodiment of a digital sense amplifier during a read operation of a selected memory cell.

FIG. 5 is a diagram illustrating an exemplary embodiment of a digital sense amplifier 34 during a read operation of a selected memory cell, represented by a resistor at 26. Sense amplifier 34 includes a sense amplifier controller 200, an N-bit counter 202, a preset register 204, threshold compare logic 206, a comparator 208, a clock 210 and a clock gate 212. The sense amplifier controller 200 is in electrical communication with threshold compare logic 206 and preset register 204, and electrically coupled to N-bit counter 202 through counter bus 201. In addition, sense amplifier controller 200 is electrically coupled to clock gate 212 through gate control conductor 203 and to the gate of reset switch 36 through switch control conductor 50.

The N-bit counter 202 is electrically coupled to threshold compare logic 206 through threshold compare bus 207, and to preset register 204 through preset register bus 209. The N-bit counter transfers count values to and from the threshold compare logic 206 and preset register 204. In addition, the N-bit counter 202 is electrically coupled to clock gate 212 though gate output conductor 205 for receiving a gated clock signal.

The clock gate 212 is electrically coupled to the clock 210 through clock conductor 211. In addition, the clock gate 212 is electrically coupled to comparator 208 through comparator conductor 213 for gating the clock signal.

A drain-source path through reset switch 36 is electrically coupled to VDD and node 48, which is electrically coupled to the comparator 208 of sense amplifier 34. In addition, node 48 is electrically coupled to direct injection charge amplifier 32 and capacitor 38 that is coupled to ground at 54. The charge amplifier 32 is electrically coupled to memory cell 26 through charge amplifier conductor 44 and steering circuit 30 (not shown in FIG. 5).

During a read operation, row decode circuit 28 electrically couples the selected memory cell 26 to ground and steering circuit 30 electrically couples the selected memory cell 26 to charge amplifier conductor 44 and charge amplifier 32. A sense voltage Vs is provided to charge amplifier 32 and charge amplifier 32 provides a corresponding sense voltage Vs' across the selected memory cell 26.

Sense amplifier controller 200 provides a control signal to the gate of reset switch 36 to turn the reset switch 36 on and provide the supply voltage VDD to integrator capacitor 38. Sense amplifier controller 200 provides a control signal to switch the reset switch 36 off, after the integrator capacitor 38 has been charged. The sense current Is flows from capacitor 38 through charge amplifier 32 and the selected memory cell 26. As long as the voltage at node 48 is greater than the voltage across the selected memory cell 26, the capacitor 38 functions as a linear integrator.

The charge amplifier 32 controls the sense voltage Vs' across the selected memory cell 26. The sense voltage Vs' is held essentially constant and is independent of the sense current Is flowing through the selected memory cell 26. The current that flows through the charge amplifier 32 is directly proportional to the resistance through the selected memory cell 26. The charge amplifier 32 includes a high gain, negative feedback amplifier for maintaining the sense voltage Vs' at a constant value and minimizing the variance of the sense voltage Vs' over a wide range of sense currents Is.

In the exemplary embodiment, the resistance through selected memory cell 26 and the capacitance of capacitor 38 determine how quickly capacitor 38 is discharged after reset switch 36 is switched off. A given capacitor 38 discharges more quickly with the selected memory cell 26 in a low resistive state having a resistance of R, as compared to the selected memory cell 26 in a high resistive state having a resistance of R+ΔR.

Sense amplifier 34 measures the integration time to determine the resistive state of the selected memory cell 26. The clock gate 212 receives signals from sense amplifier controller 200, comparator 208 and clock 210. The clock gate 212 provides a gated clock signal to N-bit counter 202 to increment the N-bit counter 202. A high speed clock signal is provided to clock gate 212 by clock 210.

As sense amplifier controller 200 switches reset switch 36 off, the sense amplifier controller 200 enables the clock gate 212 to clock the N-bit counter 202. The comparator 208 compares the voltage at node 48 to a DC reference voltage Vref. As the voltage at node 48 reaches the reference voltage Vref, comparator 208 provides a signal to clock gate 212 to disable clocking of the N-bit counter 202. The count value in the N-bit counter 202 indicates the amount of time it took for the voltage at node 48 to decay to reference voltage Vref.

Sense amplifier controller 200 controls read circuit 24 to operate in different modes including read operations and calibration of read circuit 24. Controller 200 controls reset switch 36, clock gate 212, counter 202, preset register 204 and threshold compare logic 206.

The preset register 204 is an N-bit preset register that loads its contents into counter 202. The preset register 204 is loaded with specific values by sense amplifier controller 200, such as for initialization or for completing a multiple sense read operation. In other embodiments, specific values can be supplied through input pads of memory device 20.

The threshold compare logic 206 is controlled by sense amplifier controller 200 to compare a count value from counter 202 to a set of threshold values. In the exemplary embodiment, threshold compare logic 206 categorizes a final count from counter 202 into one of five categories. The five categories include a low resistive state region, a high resistive state region, an out-of-range low region, an out-of-range high region and a dubious region. The dubious region is situated between the low and high resistive state regions. The out-of-range low region includes resistance values below the low resistive state region and the out-of-range high region includes resistance values above the high resistive state region.

The threshold compare logic 206 is controlled by sense amplifier controller 200 to receive a final count from counter 202 and categorize the count into one of the five categories. The threshold compare logic 206 provides a logic "0" or "1" to N-bit counter 202, which provides an output signal DOUT to output register 56 and I/O pad 58. The threshold compare logic 206 also provides status flags to sense amplifier controller 200. The status flags indicate the category of the final count from counter 202. Sense amplifier controller 200 provides status flags to external circuits through output pads of memory device 20.

In the exemplary embodiment, a read operation is a multiple sense operation including three sense operations and two write operations. To sense the resistive state of a selected memory cell 26, row decode circuit 28 selects a word line 40a–40c and steering circuit 30 selects a bit line 42a–42c. The selected word line 40a–40c and the selected bit line 42a–42c cross at the selected memory cell 26. The resistance through the selected memory cell 26 is sensed in a first sense operation to obtain a first count in counter 202. Sense amplifier controller 200 receives the first count from counter 202 and multiples the first count by two. The multiplication by two is accomplished by shifting a binary value one bit to the left. Sense amplifier controller 200 inverts the doubled first count to obtain a negative, doubled first count that is provided to preset register 204. The preset register 204 transfers the negative, doubled first count into counter 202 before the second sense operation.

Sense amplifier controller 200 directs memory device 20 to write the selected memory cell 26 to a high resistive state. The resistance through the selected memory cell 26 is sensed in a second sense operation after the selected memory cell 26 has been written to the high resistive state. The preset or initial value of counter 202 for the second sense operation is the negative, doubled first count provided to counter 202 from preset register 204. The second sense operation proceeds as previously described, such that counter 202 is incremented while the voltage at node 48 decays to reference voltage Vref. The negative value in counter 202 is incremented towards zero. After the second sense operation, sense amplifier controller 200 receives the second count from counter 202 and provides the second count to preset register 204. Preset register 204 loads the second count into counter 202 at the beginning of the third sense operation.

Sense amplifier controller 200 directs memory device 20 to write the selected memory cell 26 to a low resistive state. After the selected memory cell 26 has been written to the low resistive state, a third sense operation is performed on the selected memory cell 26. To begin the third sense operation, preset register 204 loads the second count value, i.e., the count value remaining in the counter 202 after the second sense operation, into counter 202. The third sense operation increments the counter 202 while the voltage at node 48 decays to the reference voltage Vref. The resulting count, referred to as the final count, is provided to threshold compare logic 206 to be categorized into one of five categories.

The threshold compare logic 206 categorizes the final count into the low resistive state region, high resistive state region, out-of-range low region, out-of-range high region or the dubious region. The threshold compare logic 206 provides a logic "0" or "1" to counter 202. The counter 202 provides the DOUT signal to output register 56. The threshold compare logic 206 also provides status flags to sense amplifier controller 200, which provides the status flags to external circuits.

In one example of a multiple sense read operation, the resistance through a selected memory cell 26 is sensed to obtain a first count of 100. In this example, a high resistive state gives a count of 110 and a low resistive state gives a count of 100. The first count of 100 is multiplied by two to obtain a doubled first count value of 200. The positive 200 count value is inverted to obtain a negative, doubled first count value of about negative 200. The negative, doubled first count value is provided to preset register 204. The selected memory cell 26 is written to a high resistive state and a second sense operation is performed. During the second sense operation, the counter increments 110 counts to obtain a second count value of about negative 90. The negative 90 count value is received by sense amplifier controller 200 and provided to preset register 204. Memory cell 26 is written to the low resistive state and the selected memory cell 26 is sensed in a third sense operation. The preset register 206 loads counter 202 with the negative 90 count value to begin the third sense operation. During the third sense operation, the counter increments 100 counts to achieve a final count value of positive 10.

In this example, the dubious region or category is defined as a region of plus or minus two around zero. The high resistive state region is between negative two and negative 15, and the low resistive state region is between positive two and positive 15. The out-of-range high region is less than negative 15 and the out-of-range low region is greater than positive 15. In a read operation, an out-of-range high or out-of-range low value may be the result of excessive noise or a non-linear resistance failure. For very high and very low resistance values, the resistance through the selected memory cell 26 changes little, if at all, with a change in the state of the selected memory cell 26. Therefore, very low resistance values, such as shorts, and very high resistance values, such as opens, result in a final count in the dubious region.

In the present example, the final count of positive 10 sits squarely in the low resistive state region. Counter 202 provides a logic "0" DOUT signal to output register 56 and sense amplifier controller 200 sets a flag that indicates a valid logic "0". In the exemplary embodiment, sense amplifier controller 200 sets a single flag for each one of the five categories. In another embodiment, sense amplifier controller 200 can use one flag for both valid logic states, and one flag for both the out-of-range low and out-of-range high categories.

In another embodiment, sense amplifier 34 categorizes the first count of a multiple sense read operation into one of five categories or regions. In addition, sense amplifier 34 categorizes the final count into one of five regions as described for the previous embodiment. The first count is categorized into five regions including a short, an open, two delayed calibration regions and a no calibration region. The two delayed calibration regions are situated with one region between a short and the no calibration region and the other between an open and the no calibration region. The no calibration region is a middle region including the low and high resistive states. The five regions for categorizing the first count are different than the five regions for categorizing the final count.

In this embodiment, the first count is categorized into one of five regions. In the event the first count is categorized as a short or an open, sense amplifier controller 200 directs memory device 20 to do an immediate calibration of read circuit 24. After the immediate calibration, memory device 20 retests the selected memory cell 26. The sequence of categorizing as a short or an open and immediate calibration happens up to n times. Where the first count indicates an open or short n times for the same selected memory cell 26, sense amplifier controller 200 sets a flag that indicates the selected memory cell 26 is an open or a short. In the exemplary embodiment, sense amplifier controller 200 sets one flag to indicate a short and another flag to indicate an open. Memory device 20 stops sensing the resistance through the selected memory cell 26 after the selected memory cell 26 is flagged as a short or an open.

In the event the first count is categorized into one of the two delayed calibration regions, sense amplifier controller 200 sets a flag that indicates the read circuit 24 needs to be calibrated at a later time. The sense amplifier controller 200 continues with the multiple sense read operation to obtain the final count and categorize the final count into the one of five regions, as described above. The read circuit 24 can be calibrated in a delayed calibration after sensing the selected memory cell 26 or after sensing a predetermined number of memory cells 26. The delayed calibration flag is cleared after the read circuit 24 is calibrated.

In the event the first count is categorized into the no calibration category, sense amplifier controller 200 proceeds to complete the multiple sense read operation to obtain a final count. The final count is categorized into the one of five categories.

In an example of categorizing the first count, read circuit 24 performs a first sense operation on a selected memory cell 26 to obtain a first count of 100 from counter 202. The first count of 100 is received by threshold compare logic 206 to categorize the first count into one of five first sense categories. In the present example, a selected memory cell 26 in the low resistive state gives an expected first count of 100, and a memory cell 26 in the high resistive state gives an expected first count of 110. The no calibration region extends from 85 to 125. A first count in this region indicates that the sensed resistance value is acceptable for continuing the read operation. The low delayed calibration region is in a range from 70 to 85 and the high delayed calibration region is in the range 125 to 140. A first count in one of these ranges indicates that the sensed resistance value and first count is acceptable for continuing the read operation. However, the read circuit 24 needs to be calibrated at a later time. The short immediate calibration region is a count of less than 70 and the open immediate calibration region is a count of greater than 140. A first count of less than 70 or greater than 140 indicates that the read circuit 24 needs immediate calibration or the selected memory cell 26 is a short or open. In the present example, a first count of 100 is situated in the no calibration region and the read operation continues to obtain a final count and categorize the final count into one of five categories.

One embodiment of sense amplifier 34 suitable for use with the present invention is disclosed and described in U.S. Pat. No. 6,188,615, issued to Perner et al. on Feb. 13, 2001 and entitled "MRAM Device Including Digital Sense Amplifiers," which is incorporated herein by reference.

FIG. 6 is a graph illustrating the probability (p) that a read operation result is categorized into one of five categories. The read operation is a multiple sense read operation that results in a final count. The final counts are plotted to account for 100 percent of the final count samples taken from representative memory cells 26. The memory cells 26 were written to a low resistive state for one sample and a high resistive state for another sample. The final count scale is divided into five regions or ranges that are the five categories distinguished by sense amplifier 34.

In category 300, the final count is in the out-of-range high category that represents a potential error situation due to excessive noise or non-linear resistance. Sense amplifier 34 provides a logic "1" output signal to output register 56. In addition, sense amplifier 34 sets a flag that indicates the final count is in the out-of-range high category.

In category 302, the final count is in the high resistive state category. Final counts in category 302 are valid high resistive state counts. Sense amplifier 34 provides a logic "1" output signal at DOUT to output register 56. In addition, sense amplifier 34 sets a flag that indicates the final count is a valid logic "1".

In category 304, the final count is in the dubious region where a resistive state cannot be ascertained with any degree of certainty. The final count is situated between the final counts for a low resistive state and a high resistive state of the memory cells 26. In the dubious category 304, sense amplifier 34 provides a logic "0" or a logic "1" as an output signal DOUT to output register 56. The logic value provided depends on predetermined criteria, such as the previous logic value provided to output register 56. Sense amplifier 34 sets a flag that indicates the final count is situated in the dubious category 304 and provides the flag, as with all flags, to external devices as needed.

In category 306, the final count is in the low resistive state category. Final counts in category 306 are valid low resistive state counts. Sense amplifier 34 provides a logic "0" output signal at DOUT to output register 56. In addition, sense amplifier 34 sets a flag that indicates the final count is a valid logic "0".

In category 308, the final count is in the out-of-range low category that represents a potential error situation due to excessive noise or non-linear resistance. Sense amplifier 34 provides a logic "0" output signal to output register 56. In addition, sense amplifier 34 sets a flag that indicates the final count is in the out-of-range low category.

In the exemplary embodiment, threshold compare logic 206 includes threshold values for distinguishing between the five categories of resistance values and final counts sensed through memory cells 26. The threshold values are calculated from a representative sample of memory cells 26 in memory device 20. Selected memory cells 26 are sensed in the low resistive state and the high resistive state. The final counts are divided into the five categories using predetermined criteria, such as standard deviations to determine the boundaries between the five categories. The calculated threshold values are stored in the threshold compare logic 206 for categorizing the final counts into one of the five regions.

Figure 7:
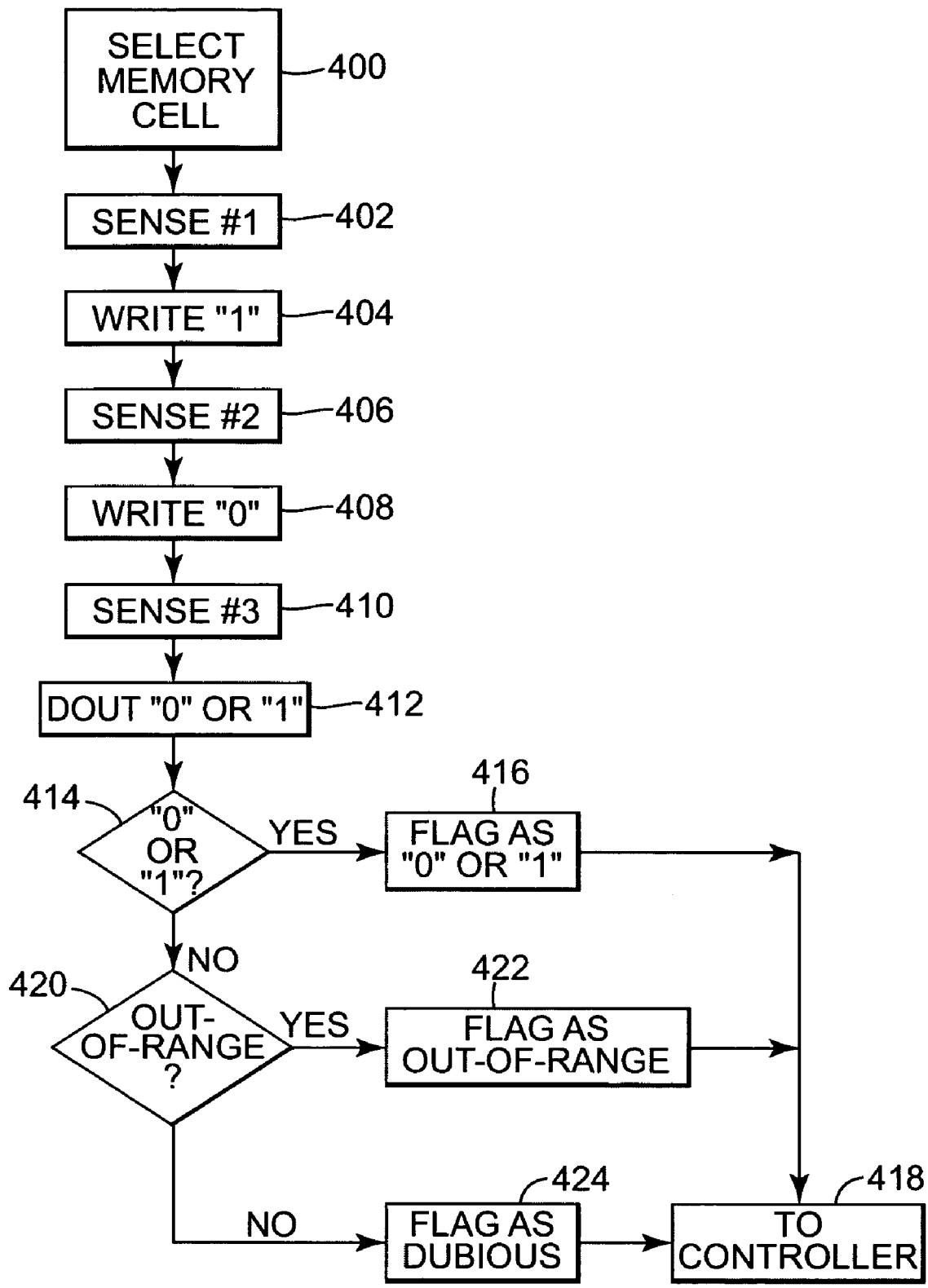
FIG. 7 is a flow chart illustrating a read operation of an exemplary embodiment of a memory device.

FIG. 7 is a flow chart illustrating a read operation of an exemplary embodiment of memory device 20. The read operation is a multiple sense and multiple write read operation including three sense operations and at least two write operations. To begin a read operation, row decode circuit 28 selects a word line 40a–40c and steering circuit 30 selects a bit line 42a–42c to select the memory cell 26 located at the cross point of the selected word line 40a–40c and the selected bit line 42a–42c, indicated at 400. In a first sense operation at 402, row decode circuit 28 couples the selected word line 40a–40c to ground, and steering circuit 30 couples the selected bit line 42a–42c to charge amplifier 32. Sense amplifier 34 controls the reset switch 36 to conduct and charge capacitor 38 toward supply voltage VDD at node 48, and then controls the reset switch 36 to stop conducting. Charge amplifier 32 provides a constant voltage to the selected bit line 42a–42c. The constant voltage produces a constant sense current Is through the selected memory cell 26. The sense current Is is provided by capacitor 38. Sense amplifier 34 counts to a first count while the capacitor 38 decays to a reference voltage. The first count is received by sense amplifier controller 200 and multiplied by two. The doubled first count is inverted to make it into a negative number that is stored in preset register 204.

The write circuit writes the selected memory cell 26 to a high resistive state, referred to herein as a logic "1", at 404. After the selected memory cell 26 has been written to the high resistive state, read circuit 24 performs a second sense operation at 406. At the beginning of the second sense operation, preset register 204 loads the negative of the doubled first count into counter 202. Row decode circuit 28 and steering circuit 30 couple the selected memory cell 26 to ground and charge amplifier 32. Sense amplifier 34 controls the reset switch 36 to conduct and charge the capacitor 38 toward supply voltage VDD at node 48, and then controls the reset switch 36 to stop conducting. Charge amplifier 32 provides a constant voltage across the selected memory cell 26 to produce a constant sense current Is through the selected memory cell 26. Counter 202 increments toward zero while the voltage at node 48 decays to the reference voltage. The second count in counter 202 is received by sense amplifier controller 200 and loaded into preset register 204.

The write circuit writes the selected memory cell 26 to a low resistive state, referred to herein as a logic "0" at 408. After the selected memory cell 26 has been written to a logic "0", read circuit 24 performs a third sense operation at 410. At the beginning of the third sense operation, preset register 204 loads counter 202 with the second count. Row decode circuit 28 and steering circuit 30 couple the selected memory cell 26 to ground and charge amplifier 32. Sense amplifier 34 controls the reset switch to charge capacitor 38 toward the supply voltage VDD at node 48, and then controls the reset switch 36 to stop conducting. Charge amplifier 32 provides a constant voltage across selected memory cell 26 to produce a constant sense current Is through the selected memory cell 26. Counter 202 increments while the voltage at node 48 decays to the reference voltage. The resulting count in counter 202, also referred to as the final count, is a net count value of the three sense operations 402, 406, and 410. Threshold compare logic 206 receives the final count for categorizing the final count into one of five categories. Sense amplifier 34 provides a logic "0" or "1" output signal DOUT at 412. In addition, memory device 20 writes the selected memory cell 26 to a logic "0" or "1" state as determined by the final count.

Threshold compare logic 206 categorizes the final count into one of five categories. The threshold compare logic 206 can perform categorization decisions in any order. In the exemplary embodiment, the threshold compare logic 206 decides if the final count is situated in the valid low resistive state category 306 or the valid high resistive state category 302 at 414. In the event the final count is in category 306 or category 302, threshold compare logic 206 and sense amplifier controller 200 set a flag to indicate the final count is a valid logic "0" or a flag to indicate the final count is a valid logic "1" at 416. Control passes to sense amplifier controller 200 at 418.

Where the final count is not situated in the low resistive state category 306 or the high resistive state category 302, threshold compare logic 206 decides if the final count is situated in the out-of-range high category 300 or the out-of-range low category 308 at 420. In the event the final count indicates out-of-range high or out-of-range low, threshold compare logic 206 and sense amplifier controller 200 set an out-of-range high flag or an out-of-range low flag at 422. Control passes to sense amplifier controller 200 at 418.

In the event the final count does not indicate out-of-range high or out-of-range low, it is assumed that the final count is situated in the dubious region or category 304. Threshold compared logic 206 and sense amplifier controller 200 set a flag to indicate the final count is in the dubious category 304 at 424. Control is passed to sense amplifier controller 200 at 418. The result of the read operation is a logic "0" or "1" output signal DOUT and a flag to indicate the category of the final count.

FIG. 8 is a graph for another embodiment illustrating the probability (p) that a first sense operation result is categorized into one of five categories. The first sense operation result is a first sense count that is directly related to the resistance value through the selected memory cell 26. The resistance value includes the effect of sneak path resistances, series path resistances and circuit noise. The first sense counts are plotted to account for 100 percent of the first sense count samples taken from representative memory cells 26. The memory cells 26 are written to a low resistive state for one sample and a high resistive state for another sample. The first sense count scale is divided into five regions or ranges that are the five categories distinguished by sense amplifier 34 for a first count.

In category 500, the resistance value is very low and category 500 represents a shorted memory cell 26. Sense amplifier 34 controls the memory device 20 to immediately calibrate read circuit 24. After calibration, the selected memory cell 26 is sensed again. In the event a short category 500 is indicated n times, sense amplifier 34 sets a flag to indicate that the selected memory cell 26 is a short.

In category 502, the resistance value is larger than the resistance value of the shorted memory cell 26. However, the resistance value is not large enough to be categorized into a no calibration region 504. Category 502 represents a low delayed calibration region. Sense amplifier 34 sets a flag for calibration that indicates the sensed resistance value is in the low delayed calibration category 502. The memory device 20 continues with the read operation. Calibration of read circuit 24 takes place after sensing the selected memory cell 26 or after a predetermined number of memory cells 26 have been sensed.

Category 504 represents resistance values that indicate no calibration is needed. Category 504 is a no calibration region including the low and high resistive states. Memory device 20 continues with the read operation.

In category 506, the resistance value is smaller than the resistance value of an open memory cell 26. However, the resistance value is not small enough to be categorized in the no calibration region 504. Category 506 represents a high delayed calibration region. Sense amplifier 34 sets a flag for calibration that indicates the sensed resistance value is in the high delayed calibration category 506. The memory device 20 continues with the read operation. Calibration of the read circuit 24 takes place after sensing the selected memory cell 26 or after a predetermined number of memory cells 26 have been sensed.

In category 508, the resistance value is very high and category 508 represents an open memory cell 26. Sense amplifier 34 controls the memory device 20 to immediately calibrate read circuit 24. After calibration, the selected memory cell 26 is sensed again. In the event an open category 508 is indicated n times, sense amplifier 34 sets a flag to indicate that the sensed resistance value is an open.

Threshold compare logic 206 includes threshold values for distinguishing between the five categories of resistance values sensed through memory cells 26. The threshold values are calculated from a representative sample of memory cells 26 in memory device 20. Selected memory cells 26 are sensed in the low resistive state and the high resistive state. The sensed resistance values are divided into the five categories using predetermined criteria, such as standard deviations to determine the boundaries between the five categories. The calculated threshold values are stored in the threshold compare logic 206 for categorizing a first count into one of the five regions.

Figure 9A:
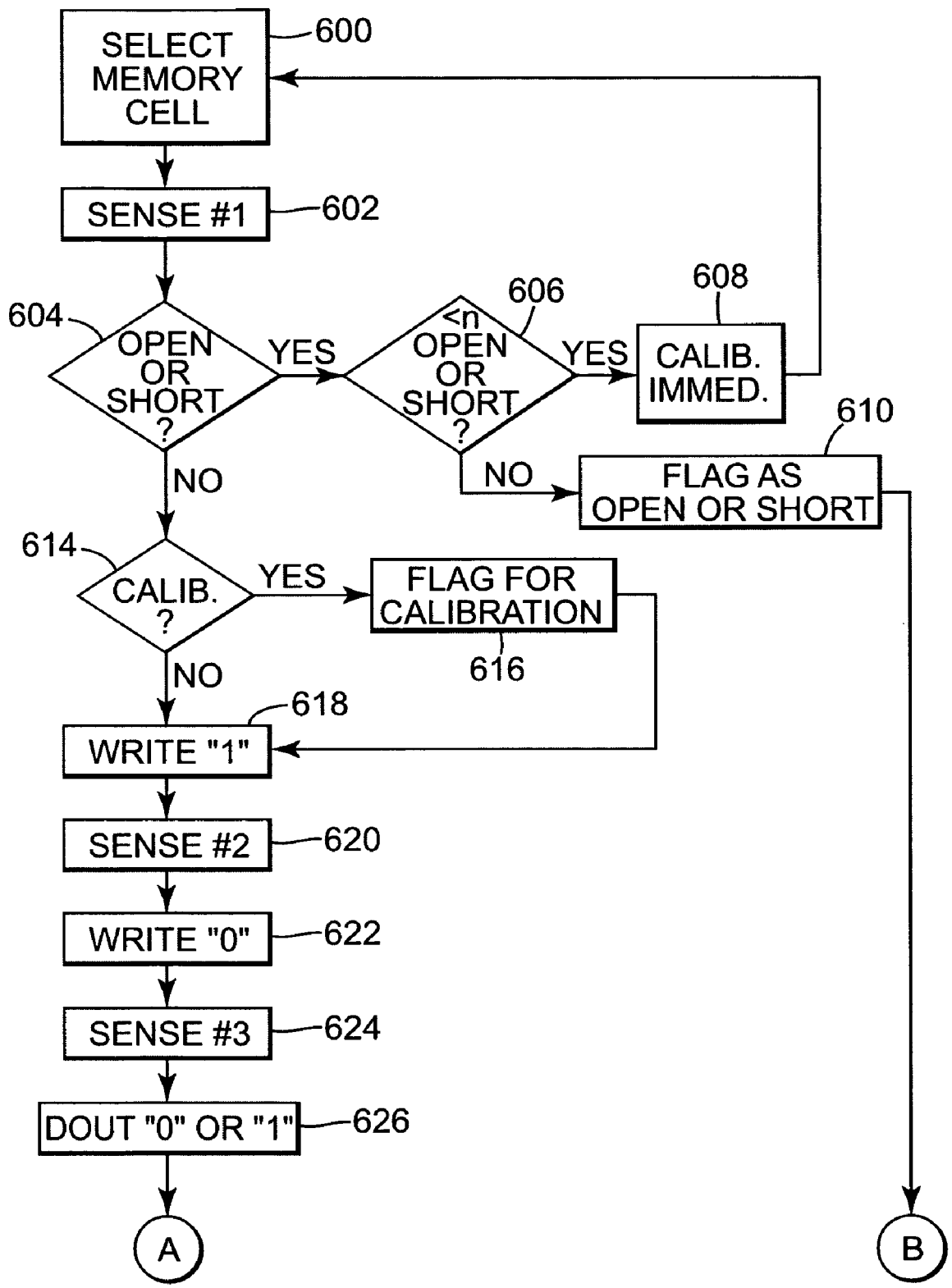
FIGS. 9a and 9b make up a flow chart illustrating a read operation of another embodiment of a memory device.
Figure 9B:
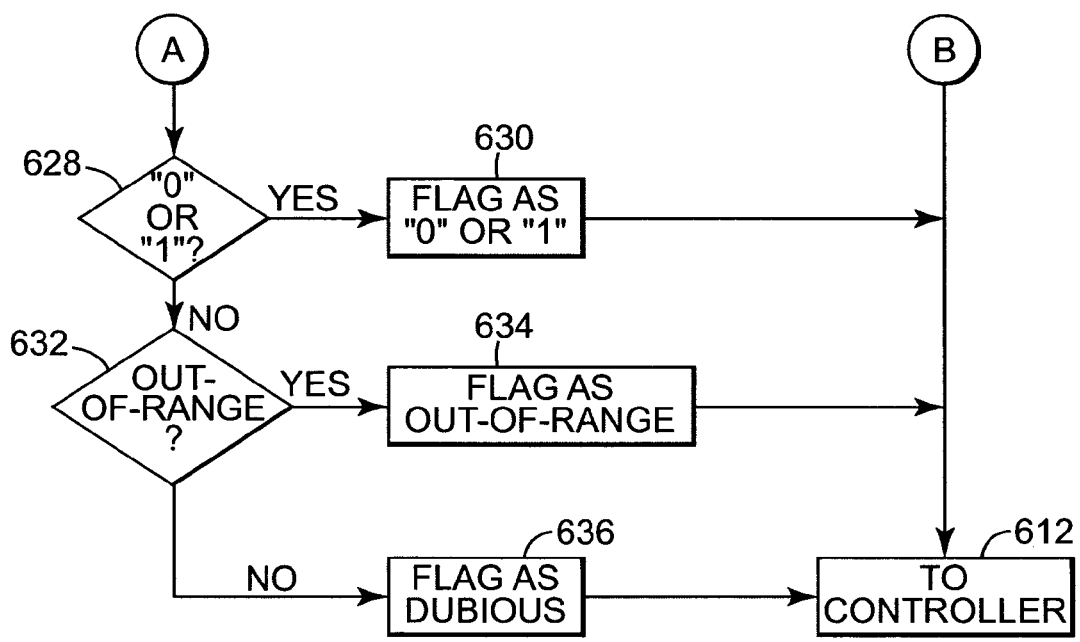

FIGS. 9a and 9b are flowcharts illustrating a read operation of another embodiment of memory device 20. The read operation is a multiple sense, multiple write read operation including three sense operations and at least two write operations. After the first sense operation, the first count is categorized into one of five categories. In the event the first count is categorized into a short or open category 500 or 508, read circuit 24 is calibrated immediately. Where the first count is categorized into one of two delayed calibration regions 502 or 506, read circuit 24 is calibrated at a later time. The other category 504 indicates read circuit 24 does not need calibration. Where the first count is categorized into one of the two delayed calibration regions 502 and 506 or the no calibration region 504, the read operation continues with multiple sense and write operations to obtain a final count. The final count is categorized into one of the five categories illustrated in FIG. 6.

To begin a read operation, row decode circuit 28 selects a word line 40a–40c and steering circuit 30 selects a bit line 42a–42c at 600 to select a memory cell 26. At 602, row decode circuit 28 electrically couples the selected word line 40a–40c to ground and steering circuit 30 electrically couples the selected bit line 42a–42c to charge amplifier 32. Sense amplifier 34 turns on reset switch 36 to charge capacitor 38 toward supply voltage VDD. Sense amplifier 34 turns reset switch 36 off after capacitor 38 is charged. Charge amplifier 32 provides a constant voltage across the selected memory cell 26 to produce a constant sense current Is through the selected memory cell 26. The sense current Is is provided by capacitor 38. Counter 202 of sense amplifier 34 increments while the voltage at node 48 decays to the reference voltage. After the first sense operation, the count in counter 202, referred to as the first count, is received by the threshold compare logic 206 and sense amplifier controller 200. Sense amplifier controller 200 multiplies the first count by two and inverts it to make it a negative number. This negative, doubled first count is provided to preset register 204. The threshold compare logic 206 categorizes the first count into one of five categories.

Threshold compare logic 206 checks to see if the first count is situated in an open category 508 or a short category 500 at 604. Where the first count is categorized as an open or a short, threshold compare logic 206 checks to see if the open or short categorization has occurred n times before at 606. Where the first count for the selected memory cell 26 has not been categorized as an open or a short n times before, memory device 20 immediately calibrates the read circuit 24 at 608. After the read circuit 24 is calibrated, read circuit 24 reselects the memory cell 26 at 600 to attempt reading the selected memory cell 26 again. In the event the first count has indicated an open or a short n times in a row, a flag is set at 610 to indicate the selected memory cell 26 is an open or a short. One flag is set to indicate an open and another flag is set to indicate a short. After the appropriate flag is set, control is passed to sense amplifier controller 200 at 612.

In the event the first count is not categorized into the short category 500 or open category 508, threshold compare logic 206 checks to see if the first count is situated in a low delayed calibration category 502 or a high delayed calibration category 506 at 614. The low delayed calibration category 502 is situated between the short category 500 and a no calibration category 504. The high delayed calibration category 506 is situated between the open category 508 and the no calibration category 504. The no calibration category 504 is the category including resistance values for a memory cell 26 in a low resistive state and a high resistive state. Where the first count is situated in the low delayed calibration category 502 or the high delayed calibration category 506, threshold compare logic 206 flags read circuit 24 for delayed calibration or, in other words, for calibration at a later time at 616. One flag is used to indicate the first count is situated in the low delayed calibration category 502 and another flag is set to indicate the first count is situated in the high delayed calibration category 506. After setting a flag for delayed calibration at 616, memory device 20 proceeds with the read operation by writing the selected memory cell 26 to a high resistive state, referred to herein as logic "1", at 618. Also, in the event the first count is categorized in the no calibration category 504, memory device 20 proceeds with the read operation at 618.

The write circuit writes the selected memory cell 26 to a high resistive state at 618. After the selected memory cell 26 has been written to the high resistive state, read circuit 24 performs a second sense operation at 620. At the beginning of the second sense operation, preset register 204 loads the negative of the doubled first count into counter 202. Row decode circuit 28 and steering circuit 30 couple the selected memory cell 26 to ground and charge amplifier 32. Sense amplifier 34 controls the reset switch 36 to conduct and charge the capacitor 38 toward supply voltage VDD at node 48, and then controls the reset switch 36 to stop conducting. Charge amplifier 32 provides a constant voltage across the selected memory cell 26 to produce a constant sense current Is through the selected memory cell 26. Counter 202 increments toward zero while the voltage at node 48 decays to the reference voltage. The second count in counter 202 is received by sense amplifier controller 200 and loaded into preset register 204.

The write circuit writes the selected memory cell 26 to a low resistive state, referred to herein as a logic "0" at 622. After the selected memory cell 26 has been written to a logic "0", read circuit 24 performs a third sense operation at 624. At the beginning of the third sense operation, preset register 204 loads counter 202 with the second count. Row decode circuit 28 and steering circuit 30 couple the selected memory cell 26 to ground and charge amplifier 32. Sense amplifier 34 controls the reset switch to charge capacitor 38 toward the supply voltage VDD at node 48, and then controls the reset switch 36 to stop conducting. Charge amplifier 32 provides a constant voltage across selected memory cell 26 to produce a constant sense current Is through the selected memory cell 26. Counter 202 increments while the voltage at node 48 decays to the reference voltage. The resulting count in counter 202, also referred to as the final count, is a net count value of the three sense operations 602, 620, and 624. Threshold compare logic 206 receives the final count for categorizing the final count into one of five categories. Sense amplifier 34 provides a logic "0" or "1" output signal DOUT at 626. In addition, memory device 20 writes the selected memory cell 26 to a logic "0" or "1" state as determined by the final count.

Threshold compare logic 206 categorizes the final count into one of five categories. The threshold compare logic 206 can perform categorization decisions in any order. The threshold compare logic 206 decides if the final count is situated in the valid low resistive state category 306 or the valid high resistive state category 302 at 628. In the event the final count is in category 306 or category 302, threshold compare logic 206 and sense amplifier controller 200 set a flag to indicate the final count is a valid logic "0" or a flag to indicate the final count is a valid logic "1" at 630. Control passes to sense amplifier controller 200 at 612.

Where the final count is not situated in the low resistive state category 306 or the high resistive state category 302, threshold compare logic 206 decides if the final count is situated in the out-of-range high category 300 or the out-of-range low category 308 at 632. In the event the final count indicates out-of-range high or out-of-range low, threshold compare logic 206 and sense amplifier controller 200 set an out-of-range high flag or an out-of-range low flag at 634. Control passes to sense amplifier controller 200 at 612.

In the event the final count does not indicate out-of-range high or out-of-range low, it is assumed that the final count is situated in the dubious region or category 304. Threshold compared logic 206 and sense amplifier controller 200 set a flag to indicate the final count is in the dubious category 304 at 636. Control is passed to sense amplifier controller 200 at 612. The result of the read operation is a logic "0" or "1" output signal DOUT and a flag to indicate the category of the final count.

What is claimed is:

1. A magnetic memory, comprising:
    an array of memory cells configured to provide first logic value and second logic value resistive states; and
    a read circuit configured to sense a resistance through a memory cell in the array of memory cells to obtain a sense result and categorize the sense result into one of at least three different categories comprising a middle category situated between the first logic value and second logic value resistive states.

2. The magnetic memory of claim 1, where the at least three different categories comprise a first logic value resistive state category and a second logic value resistive state category, where the middle category is situated between the first logic value resistive state category and the second logic value resistive state category.

3. The magnetic memory of claim 1, where the at least three different categories comprise five categories comprising a first logic value resistive state category and a second logic value resistive state category.

4. The magnetic memory of claim 1, where the at least three different categories comprise an out-of-range low category.

5. The magnetic memory of claim 1, where the at least three different categories comprise an out-of-range high category.

6. The magnetic memory of claim 1, where the read circuit is configured to provide a read operation comprising multiple sense operations to obtain the sense result.

7. A magnetic memory, comprising:
an array of memory cells configured to provide resistive states; and
a read circuit configured to sense a resistance through a memory cell in the array of memory cells to obtain a sense result and categorize the sense result into one of at least three different categories comprising a middle category situated between the resistive states, where the read circuit is configured to provide a read operation comprising multiple sense operations to obtain the sense result, where the sense result from a shorted memory cell is categorized into the middle category.

8. A magnetic memory, comprising:
an array of memory cells configured to provide resistive states; and
a read circuit configured to sense a resistance through a memory cell in the array of memory cells to obtain a sense result and categorize the sense result into one of at least three different categories comprising a middle category situated between the resistive states, where the read circuit is configured to provide a read operation comprising multiple sense operations to obtain the sense result, where the sense result from an open memory cell is categorized into the middle category.

9. The magnetic memory of claim 1, where the read circuit is configured to provide a flag that indicates the sense result category.

10. The magnetic memory of claim 1, where the read circuit is configured to provide a logic level output.

11. The magnetic memory of claim 1, where the read circuit is configured to categorize the sense result after a first sense operation.

12. The magnetic memory of claim 1, where the sense result is a count and the count is compared to threshold values to categorize the count.

13. The magnetic memory of claim 1, where the read circuit comprises:
a direct injection charge amplifier configured to provide a sense current through the memory cell;
a capacitor configured to provide the sense current to the direct injection charge amplifier; and
a sense amplifier configured to provide a count based on the time it takes for the capacitor to decay to a reference voltage.

14. A magnetic memory, comprising:
an array of memory cells;
means for reading the memory cells in the array of memory cells to obtain read operation results; and
means for categorizing the read operation results into categories comprising a category between a first logic value resistive state category and a second logic value resistive state category.

15. The magnetic memory of claim 14, where the means for reading the memory cells comprises a read circuit configured to provide multiple sense operations in a read operation to obtain a net count as one of the read operation results.

16. The magnetic memory of claim 14, where the means for categorizing is configured to receive a net count from the means for reading the memory cells and categorize the net count into one of the categories.

17. A magnetic memory, comprising:
a memory cell; and
a read circuit configured to sense a resistance through the memory cell to obtain a sense result and provide immediate calibration if the sense result indicates a shorted memory cell and if the sense result indicates an open memory cell, and delayed calibration if the sense result indicates the resistance is greater than a shorted memory cell and less than a first logic value resistive state of the memory cell and if the sense result indicates the resistance is less than an open memory cell and greater than a second logic value resistive state of the memory cell.

18. The magnetic memory of claim 17, where the read circuit is configured to categorize the sense result into categories comprising a short category, an open category, a low delayed calibration category and a high delayed calibration category.

19. The magnetic memory of claim 17, where the read circuit is configured to provide a first sense result from a first sense operation as the sense result and categorize the sense result into categories comprising a no calibration category that comprises first logic value resistive state values and second logic value resistive state values and provide a net result from a multiple sense read operation and categorize the net result into one of a plurality of categories based on the net result.

20. The magnetic memory of claim 19, where the plurality of categories comprises a middle category between the first logic value resistive state values and the second logic value resistive state values of the memory cell.

21. The magnetic memory of claim 19, where the plurality of categories comprises a dubious category, a first logic value resistive state category and a second logic value resistive state category, and the dubious category is situated between the first logic value resistive state category and the second logic value resistive state category.

22. A method of reading a magnetic memory, comprising:
sensing resistance through a memory cell of the magnetic memory to obtain a net sensed result value; and
categorizing the net sensed result value into a plurality of different resistive regions comprising a first logic value resistive state region, a second logic value resistive state region and a middle region situated between the first logic value resistive state region and the second logic value resistive state region.

23. The method of claim 22, where sensing resistance through the memory cell comprises a multiple sense read operation comprising three sense operations.

24. The method of claim 22, where the net sensed result value is a count that corresponds to resistances sensed through the memory cell.

25. The method of claim 22, where categorizing the net sensed result value comprises comparing the net sensed result value to thresholds and providing a flag to indicate the net sensed result value region.

26. A method of reading a magnetic memory, comprising:
sensing a memory cell to obtain a first sense result;
categorizing the first sense result into regions comprising immediate calibration and delayed calibration regions; and
responding based on the category of the first sense result.

27. The method of claim 26, where responding comprises providing an immediate calibration response if the first sense result is an open and if the first sense result is a short.

28. The method of claim 27, where responding comprises providing a delayed calibration response if the first sense result is between a short and a first logic value resistive state value and if the first sense result is between an open and a second logic value resistive state value.

29. The method of claim 28, comprising:
sensing the memory cell in a multiple sense read operation to obtain a final result;
categorizing the final result.

30. The method of claim 29, where categorizing the final result comprises situating the final result into one of a plurality of regions comprising first logic value resistive state and second logic value resistive state regions.

31. A magnetic memory, comprising:
- an array of memory cells configured to provide logic 0 and logic 1 resistive states; and
- a read circuit configured to sense a resistance through a memory cell in the array of memory cells to obtain a sense result and categorize the sense result into one of at least three different categories comprising a middle category situated between the logic 0 and logic 1 resistive states.

32. The magnetic memory of claim 31, where the at least three different categories comprise five categories including a logic 0 resistive state category, a logic 1 resistive state category, an out-of-range low category, and an out-of-range high category.

* * * * *

UNITED STATES PATENT AND TRADEMARK OFFICE
CERTIFICATE OF CORRECTION

| | | |
|---|---|---|
| PATENT NO. | : 6,999,366 B2 | Page 1 of 1 |
| APPLICATION NO. | : 10/727273 | |
| DATED | : February 14, 2006 | |
| INVENTOR(S) | : Frederick A. Perner et al. | |

It is certified that error appears in the above-identified patent and that said Letters Patent is hereby corrected as shown below:

On the title page, item (73), in "Assignee", in column 1, line 2, delete "LP." and insert -- L.P. --, therefor.

Signed and Sealed this

Twenty-third Day of June, 2009

JOHN DOLL
*Acting Director of the United States Patent and Trademark Office*